(12) United States Patent
Lee et al.

(10) Patent No.: US 8,120,241 B2
(45) Date of Patent: Feb. 21, 2012

(54) DISPLAY DEVICE HAVING A WHITE LIGHT SOURCE AND A DICHROIC LAYER

(75) Inventors: Joon-Gu Lee, Suwon-si (KR); Young-Woo Song, Suwon-si (KR); Kyu-Hwan Hwang, Suwon-si (KR); Jong-Seok Oh, Suwon-si (KR); Jae-Heung Ha, Suwon-si (KR); Chul-Woo Park, Suwon-si (KR); Jong-Hyuk Lee, Suwon-si (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 62 days.

(21) Appl. No.: 12/073,388

(22) Filed: Mar. 5, 2008

(65) Prior Publication Data

US 2008/0218067 A1    Sep. 11, 2008

(30) Foreign Application Priority Data

Mar. 7, 2007    (KR) .................. 10-2007-0022594

(51) Int. Cl.
*H01L 51/50* (2006.01)
*H01L 51/52* (2006.01)

(52) U.S. Cl. ........................................................ 313/504
(58) Field of Classification Search .................. 313/112
See application file for complete search history.

(56) References Cited

U.S. PATENT DOCUMENTS

| 4,398,805 A | 8/1983 | Cole |
| 2002/0186469 A1 | 12/2002 | Kawazu et al. |
| 2004/0095644 A1* | 5/2004 | Berger et al. ............... 359/490 |
| 2005/0194896 A1* | 9/2005 | Sugita et al. ............... 313/506 |
| 2005/0253494 A1 | 11/2005 | Choi |
| 2006/0046163 A1* | 3/2006 | Broer et al. ................. 430/7 |
| 2006/0066228 A1* | 3/2006 | Antoniadis et al. ......... 313/506 |
| 2006/0187384 A1 | 8/2006 | Hisatake |
| 2007/0019292 A1 | 1/2007 | Kim et al. |
| 2008/0157655 A1 | 7/2008 | Choi et al. |

FOREIGN PATENT DOCUMENTS

| CN | 1908704 A | 2/2007 |
| JP | 09-189811 A | 7/1997 |
| JP | 2002-141171 A | 5/2002 |
| JP | 2002-267842 A | 9/2002 |
| JP | 2004-139849 | 5/2004 |
| JP | 2004-361774 A | 12/2004 |

(Continued)

OTHER PUBLICATIONS

Dirix et al., "Oriented Polymer/Metal Nanocomposites: A New Method for the Production of Polarization Dependent Color Filters", 1999, Materials Research Society, Mat. Res. Soc. Symp. Proc., vol. 559, pp. 147-152.*

(Continued)

*Primary Examiner* — Toan Ton
*Assistant Examiner* — Britt D Hanley
(74) *Attorney, Agent, or Firm* — Lee & Morse, P.C.

(57) ABSTRACT

A display device includes a substrate, a white light source on the substrate, a dichroic layer between a viewing surface of the display device and the white light source, the dichroic layer being configured to allow light of a predetermined wavelength band to be transmitted therethrough, and a ¼ wavelength layer between the dichroic layer and the white light source.

19 Claims, 8 Drawing Sheets

FOREIGN PATENT DOCUMENTS

| | | |
|---|---|---|
| JP | 2005-283982 | 10/2005 |
| JP | 2007-025692 A | 2/2007 |
| KR | 10-2006-0022079 A | 3/2006 |
| KR | 10 2008-0061791 A | 7/2008 |
| WO | WO 2005/041155 A1 | 5/2005 |

OTHER PUBLICATIONS

Chinese Registration Determination Certificate in CN 101262727 B, dated Jul. 20, 2011 (Lee et al.).

* cited by examiner

EXTERNAL LIGHT

EXTERNAL LIGHT

EXTERNAL LIGHT

EXTERNAL LIGHT

DISPLAY DEVICE HAVING A WHITE LIGHT SOURCE AND A DICHROIC LAYER

BACKGROUND OF THE INVENTION

1. Field of the Invention

Embodiments relate to a display device having a white light source and associated methods. More particularly, embodiments relate to a display device having a white light source capable of displaying a color image without a color filter and minimizing or preventing reduction in contrast due to reflection of external light, and associated methods.

2. Description of the Related Art

Display devices having a white light source typically transmit white light through a color filter, and separate the white light into three primary colors. However, a color filter is required to achieve this.

Meanwhile, display devices may have reduced contrast due to light reflected therefrom when viewed in bright environments (e.g., in sunlight). One way of improving contrast in display devices is to use a circular polarizer. A conventional circular polarizer may be in the form of a film, and may be realized by attaching a linear polarization film and a $\lambda/4$ retardation film to an image display surface using an adhesive. However, such a film-type circular polarizer may be thick, as it includes multiple films and an adhesive layer.

Accordingly, a thin display device having a white light source that can display color images and improve contrast without a circular polarizer film and a color filter is needed.

SUMMARY OF THE INVENTION

Embodiments are therefore directed to a display device having a white light source and associated methods that substantially overcome one or more of the problems due to the limitations and disadvantages of the related art.

It is therefore a feature of an embodiment to provide a thin display device having a white light source that display color images.

It is therefore another feature of an embodiment to provide a thin display device having a white light source having improved contrast.

At least one of the above and other features and advantages may be realized by providing a display device including a substrate, a white light source on the substrate, a dichroic layer between a viewing surface of the display device and the white light source, the dichroic layer being configured to allow light of a predetermined wavelength band to be transmitted therethrough, and a ¼ wavelength layer between the dichroic layer and the white light source.

The dichroic layer may include ellipsoidal shaped metal particles on a surface, wherein the predetermined wavelength band is in accordance with an aspect ratio of the metal particles.

The dichroic layer may be on the substrate, the ¼ wavelength layer may be on the dichroic layer, and the white light source may be on the ¼ wavelength layer.

The ¼ wavelength layer may be on a surface of the substrate, the white light source may be on the ¼ wavelength layer, and the dichroic layer may be on a surface of the substrate opposite to that of the ¼ wavelength layer.

The dichroic layer may include three areas through which red, blue, and green light is transmitted, respectively.

The display device may include a sealing member on the white light source. An image may be displayed towards the sealing member. The sealing member may be transparent. The dichroic layer may be on a surface of the sealing member facing the white light source, and the ¼ wavelength layer may be on a surface of the dichroic layer facing the white light source. The ¼ wavelength layer may be on a surface of the sealing member facing the white light source, and the dichroic layer may be on a surface of the sealing member opposite that of the ¼ wavelength layer.

The display device may include a protective layer on the white light source. The dichroic layer may be on a surface of the sealing member facing the white light source, and the ¼ wavelength layer may be between the white light source and the protective layer. The ¼ wavelength layer may be disposed between the white light source and the protective layer, and the dichroic layer may be on a surface of the sealing member opposite that of the ¼ wavelength layer. The protective layer may include at least one of an organic insulating material and an inorganic insulating material.

An image may be displayed towards the substrate. The substrate may be transparent.

The display device may include a thin film transistor on the substrate, the white light source being electrically connected to the thin film transistor. The dichroic layer may be on the substrate, the ¼ wavelength layer may be on the dichroic layer, and the thin film transistor and the white light source may be on the ¼ wavelength layer. The ¼ wavelength layer may be on a surface of the substrate, the thin film transistor and the white light source may be on the ¼-wavelength layer, and the dichroic layer may be on a surface of the substrate opposite that of the ¼ wavelength layer.

The white light source may be an organic light-emitting device.

At least one of the above and other features and advantages maybe realized by providing a method of making a display device, including providing a substrate, forming a white light source on the substrate, forming a dichroic layer between a viewing surface of the display device and the white light source, the dichroic layer being configured to allow light of a predetermined wavelength band to be transmitted therethrough, and providing a ¼ wavelength layer between the dichroic layer and the white light source.

Forming the dichroic layer may include forming ellipsoidal shaped metal particles on a surface. Forming the ellipsoidal shaped metal particles may include controlling an aspect ratio of the ellipsoidal shaped metal particles to selectively absorb light.

The light source may be an organic light-emitting device.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION OF THE INVENTION

Figure 1:
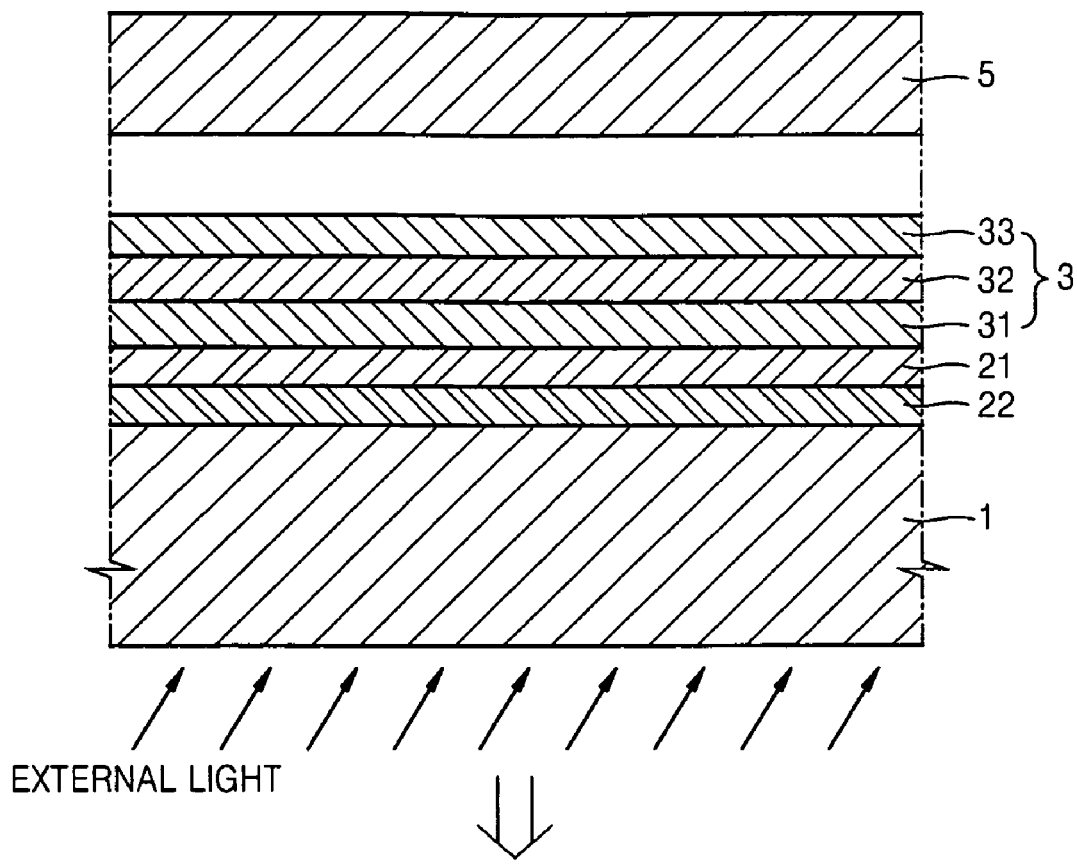
FIG. 1 illustrates a schematic cross-sectional view of a rear emission type organic light-emitting display device according to an embodiment of the present invention.

Korean Patent Application No. 10-2007-0022594, filed on Mar. 7, 2007, in the Korean Intellectual Property Office, and entitled: "Organic Light-Emitting Display Device," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

The following embodiments will be described with reference to organic light-emitting display devices, but the present invention is not so limited. Aspects of embodiments may also be applied to other displays having a white light source, including flat panel displays, e.g., liquid crystal display devices and electron emission display devices.

FIG. 1 illustrates a schematic cross-sectional view of a rear emission type organic light-emitting display device according to an embodiment of the present invention. Referring to FIG. 1, the organic light-emitting display device according to the current embodiment of the present invention may include a substrate 1, a dichroic layer 22, a ¼ wavelength layer 21, an organic light-emitting device 3, and a sealing member 5 that are sequentially stacked on the substrate 1. The light emitting device may include a first electrode layer 31, a second electrode layer 33, and an emission layer 32 interposed therebetween.

The substrate 1 may be transparent, e.g., a transparent glass substrate formed of mainly $SiO_2$. Although not shown, a buffer layer may be further disposed on the substrate 1 in order to increase substrate smoothness and prevent the infiltration of impurities. The buffer layer may be formed of at least one of $SiO_2$ and $SiN_x$, or the like.

The dichroic layer 22 may be on the substrate 1, and the ¼ wavelength layer 21 may be on the dichroic layer 22. The organic light-emitting device 3 may be on the ¼ wavelength layer 21. The dichroic layer 22 and the ¼ wavelength layer 21 may be stacked such that the dichroic layer 22 is close to where external light is incident, and the ¼ wavelength layer 21 may be on a surface of the dichroic layer 22 opposite to that on which external light is incident. Any light-transmissive layer may be interposed between the dichroic layer 22 and the ¼ wavelength layer 21.

The dichroic layer 22 may be formed of ellipsoidal-shaped metal particles. The metal particles may be Ag, Au, W, Cr, or the like. For example, an ion exchange technique of a metal mixture $NaNO_3/AgNO_3$ may be used to produce Ag particles on a substrate, e.g., the substrate 1. If the substrate on which a metal layer is formed is heated at a temperature of about 650° C. and stretched, the Ag particles may be imprinted on a surface of the substrate in a direction in which the substrate is stretched. A laser beam or an E-beam may irradiate the metal particles. A ratio of lengths of major and minor axes of the ellipsoidal-shaped metal particles, i.e., an aspect ratio, may vary according to the amount of the irradiated energy. Characteristics of the dichroic layer 22 that may be controlled by controlling formation of the ellipsoidal-shaped metal particles include polarization of incident light and absorption of light of a predetermined wavelength band.

Figure 2:
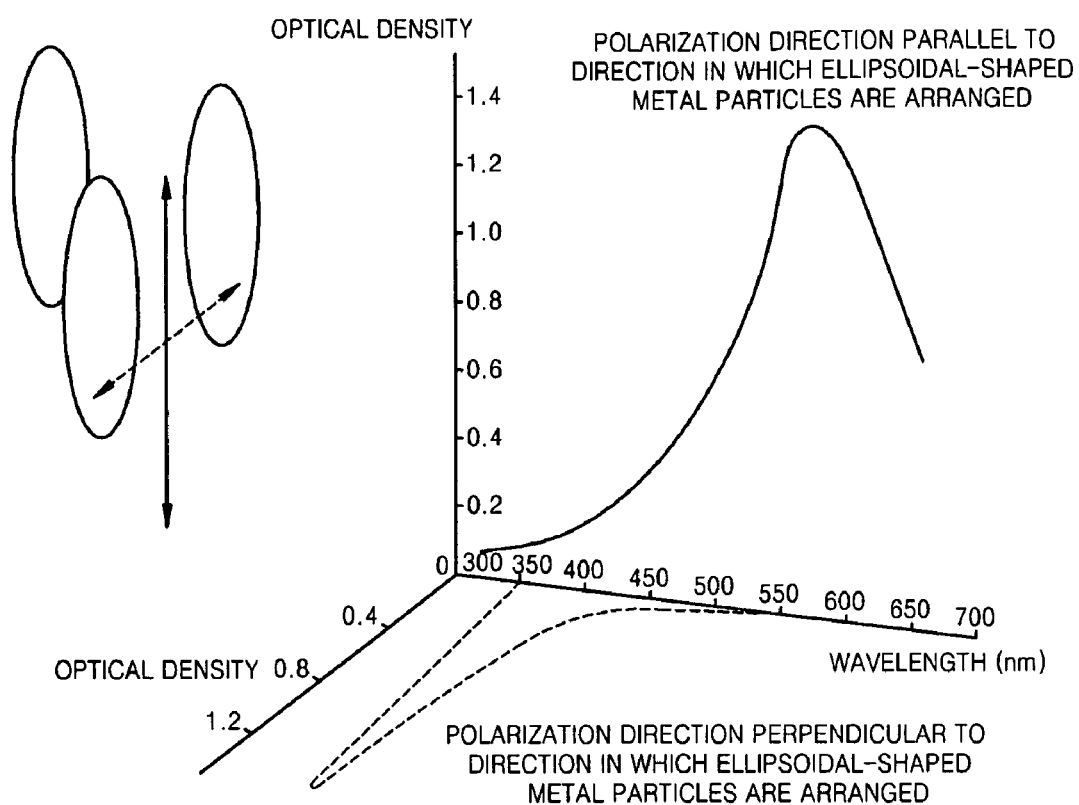
FIGS. 2 and 3 are graphs of characteristics of a dichroic layer of the rear emission type organic light-emitting display device of FIG. 1, according to an embodiment of the present invention.

FIG. 2 illustrates a graph of the polarization characteristic of the dichroic layer 22 formed of the Ag particles illustrated in FIG. 1, according to an embodiment of the present invention. As used herein, the term "dichroic layer" is to mean a layer in which light having different polarizations is absorbed by different amounts.

Referring to FIG. 2, optical density is high in a visible light area of the dichroic layer 22 in a polarization direction (a vertical axis) parallel to a direction in which the ellipsoidal-shaped Ag particles are arranged, i.e., parallel to the major axis of the elliptic, whereas the optical density is approximately zero in the visible light area of the dichroic layer 22 in a polarization direction (a horizontal axis) perpendicular to the direction in which the ellipsoidal-shaped Ag particles are arranged. That is, the dichroic layer 22 has the polarization characteristics that the direction parallel to the direction in which the ellipsoidal-shaped Ag particles are arranged is an optical transmission axis, and the polarization direction perpendicular to the direction in which the ellipsoidal-shaped Ag particles are arranged is an optical absorption axis.

Figure 3:
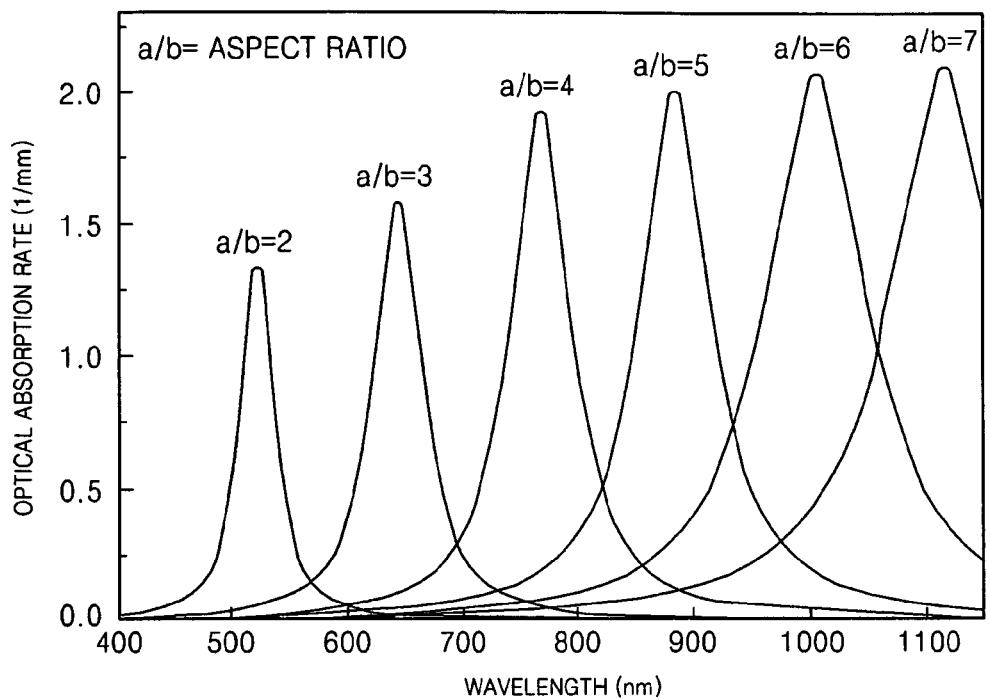

FIG. 3 illustrates a graph of the variation of an optical absorption rate of the Ag particles with respect to wavelength according to an aspect ratio a/b of the Ag particles, i.e., a ratio of lengths of major b and minor a axes of the ellipsoidal-shaped metal particles. Referring to FIG. 3, when the aspect ratio a/b of the Ag particles is 2, the optical absorption rate is highest at a wavelength of about 540 nm, which is close to a green band. When the aspect ratio a/b of the Ag particles is 3, the optical absorption rate is highest at a wavelength of about 650 nm, which is close to a red band. In other words, the amount of energy of a laser beam or an E-beam irradiated onto the Ag particles may be appropriately adjusted to vary the aspect ratio a/b of the Ag particles, so that the dichroic layer 22 may convert white light emitted from the emission layer 32 of the organic light-emitting device 3 into light of a desired color.

The dichroic layer 22 may include three areas through which red, blue, and green light, respectively, is transmitted. Therefore, according to an embodiment of the present invention, a color image of a white organic light-emitting device may be formed using the dichroic layer 22 on the substrate 1 without a color filter, thereby dramatically reducing the thickness of the white organic light-emitting device.

Figure 4:
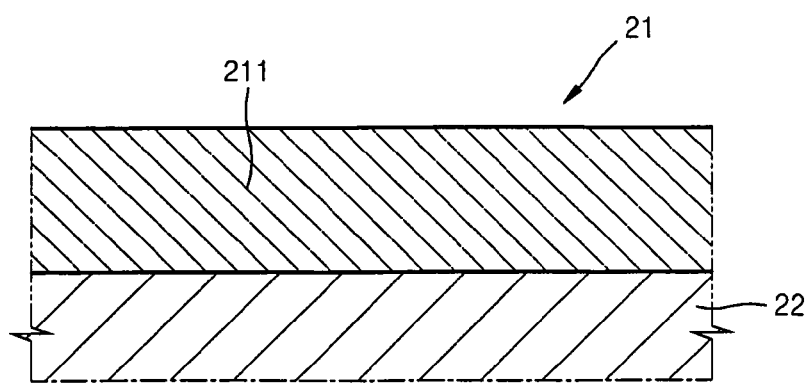
FIG. 4 illustrates a cross-sectional view of a ¼ wavelength layer of the rear emission type organic light-emitting display device of FIG. 1, according to an embodiment of the present invention.

The ¼ wavelength layer 21 may be on the dichroic layer 22 having the color and polarization characteristics described above. Referring to FIG. 4, the ¼ wavelength layer 21 may be formed by coating a liquid crystal film or by obliquely depositing an inorganic material. When using the inorganic material, micro-columns 211 may extend in an oblique direction on the surface of the ¼ wavelength layer 21, as disclosed, for example, in Korean Patent Application No. 2006-0136887, which is incorporated by reference herein in its entirety and for all purposes. The micro-columns 211 may be aligned along a direction of crystal growth.

When depositing an inorganic material, the inorganic material may grow in a cylindrical shape. Thus, in oblique deposition, these cylinders may be tilted at a predetermined angle with respect to the horizontal direction of FIG. 4. As a result, the ¼ wavelength layer 21 has birefringence characteristics. The inorganic material used for the ¼ wavelength layer 21 may be selected from various materials, e.g., $TiO_2$, $TaO_x$, CaO, BaO, and the like. When using CaO or BaO for the ¼ wavelength layer 21, moisture absorption properties, in addition to the birefringence characteristics, may be provided.

According to an embodiment of the present invention, the dichroic layer 22 and the ¼ wavelength layer 21 may constitute a circular polarizer, thereby minimizing reflection of external light. For example, when external light is incident on the bottom side of the substrate 1, light parallel to the optical absorption axis of the dichroic layer 22 is absorbed by the dichroic layer 22 and light parallel to an optical transmission axis of the dichroic layer 22 is transmitted through the dichroic layer 22. Upon passing through the ¼ wavelength layer 21, light transmitted by the dichroic layer 22 is converted into circularly polarized light rotating in a first direction. Upon reflection from the second electrode layer 33 of the organic light-emitting device 3, the circularly polarized light rotating in the first direction is converted into circularly polarized light rotating in a second direction. Upon passing through the ¼ wavelength layer 21, the circularly polarized light rotating in the second direction is converted into linearly polarized light perpendicular to the optical transmission axis of the dichroic layer 22, i.e., parallel to the optical absorption axis of the dichroic layer 22. Thus, the linearly polarized light is absorbed by the dichroic layer 22, so it is not emitted from the bottom side of the substrate 1. Therefore, reflection of external light may be minimized, resulting in better contrast.

In addition, since the dichroic layer 22 and the ¼ wavelength layer 21 are on the substrate 1 with no adhesive interposed therebetween, the thickness of the rear emission type organic light-emitting display device according to the current embodiment of the present invention may be reduced compared to conventional organic light-emitting display devices. Moreover, since there is no adhesive layer, an image from the emission layer 32 does not pass through an adhesive layer, like in conventional organic light-emitting display devices, which may result in better brightness.

Referring again in FIG. 1, the first electrode layer 31 may be formed of a transparent and conductive material, e.g., indium tin oxide (ITO), indium zinc oxide (IZO), $In_2O_3$, or ZnO. The first electrode layer 31 structured as a transparent electrode may serve as an anode when connected to an external terminal (not shown). The first electrode layer 31 may be patterned using photolithography.

In passive matrix (PM) organic light-emitting display devices, patterns of the first electrode layer 31 may be striped lines spaced apart from each other at predetermined intervals. In active matrix (AM) organic light-emitting display devices, patterns of the first electrode layer 31 may correspond to pixels. Moreover, in AM organic light-emitting display devices, a thin film transistor (TFT) layer including at least one TFT may be further disposed on the substrate 1 below the first electrode layer 31, and the first electrode layer 31 may be electrically connected to the TFT layer.

The second electrode layer 33 may be disposed above the first electrode layer 31, and may have a polarity opposite to that of the first electrode layer 31. The second electrode layer 33 may be a reflective electrode, and may be formed of at least one of aluminum, silver, and calcium. The second electrode layer 33 may serve as a cathode when it is connected to the external terminal (not shown).

In a PM organic light-emitting display device, the second electrode layer 33 may be striped lines perpendicular to striped lines of the first electrode layer 31. In an AM organic light-emitting display device, the second electrode layer 33 may correspond to each pixel. In the AM organic light-emitting display device, the second electrode layer 33 may be formed over the entire surface of an active area in which images are displayed. A detailed description thereof will be provided later.

The emission layer 32 interposed between the first electrode layer 31 and the second electrode layer 33 may emit white light in response to the electrical driving of the first electrode layer 31 and the second electrode layer 33. The white light may have a good color rendering index (CRI) (>75), and be close to a coordinate of (0.33, 0.33) in a Commission Internationale de l'Eclairage (CIE) diagram. However, the present invention is not limited thereto.

The emission layer 32 may be formed of a low molecular weight organic material or a polymer organic material. When the emission layer 32 is a low molecular weight organic layer formed of a low molecular weight organic material, a hole transport layer and a hole injection layer may be stacked on a surface of the emission layer 32 facing the first electrode layer 31, and an electron transport layer and an electron injection layer may be stacked on a surface of the emission layer 32 facing the second electrode layer 33. Of course, in addition to the hole injection layer, the hole transport layer, the electron transport layer, and the electron injection layer, various layers may be formed when needed.

When the emission layer 32 is a polymer organic layer formed of a polymer organic material, only the hole transport layer may be on a surface of the emission layer 32 facing the first electrode layer 31. The hole transport layer may be on the first electrode layer 31 by inkjet printing or spin-coating using poly-(3,4)-ethylenedioxythiophene (PEDOT), polyaniline (PANI), or the like.

In order for the emission layer 32 to emit white light, a wave conversion technique may be used, e.g., down conversion. For down conversion, phosphor is excited with blue light or violet light, various colors emitted from the phosphor are mixed using various color mixing techniques, e.g., mixing two primary colors (blue and orange) or three primary colors (red, green, and blue), or the like, and a wide band of a wavelength spectrum may be realized. However, the present invention is not limited thereto. A variety of materials and techniques may be used to produce white light.

The sealing member 5 may be on the organic light-emitting device 3 in order to protect the organic light-emitting device 3 from external contaminants, e.g., moisture, oxygen, and so forth. The sealing member 5 may be glass, a thin film member, a metal cap, etc.

While the sealing member 5 illustrated in FIG. 1 is spaced apart from the organic light-emitting device 3 by a predetermined interval, the present invention is not limited thereto. As described above, organic and inorganic thin films do not have to be spaced apart from the organic light-emitting device 3, but may be stacked directly on the organic light-emitting device 3.

According to an embodiment of the present invention, white light emitted from the emission layer 32 of the organic light-emitting device 3 passes through the dichroic layer 22, thereby being changed into light of a predetermined color, and the reflection of external light incident on the bottom side of the substrate 1 is minimized by the dichroic layer 22 and the ¼ wavelength layer 21, thereby preventing a reduction in contrast. The dichroic layer 22 and the ¼ wavelength layer 21 are on the substrate 1 to realize color images and reduced external light reflection without using a color filter or a circular polarization film, thereby reducing the thickness of the organic light-emitting display device.

Figure 5:
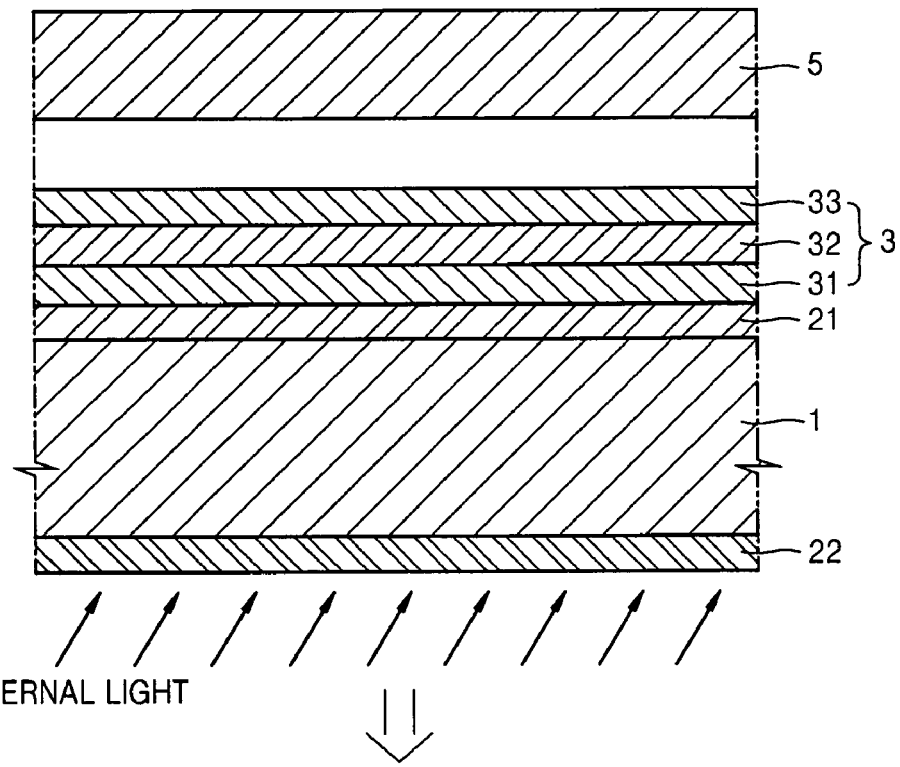
FIG. 5 illustrates a cross-sectional view of a rear emission type organic light-emitting display device according to another embodiment of the present invention.

FIG. 5 illustrates a schematic cross-sectional view of a rear emission type organic light-emitting display device according to another embodiment of the present invention. Referring to FIG. 5, the dichroic layer 22 may be on the surface of the substrate 1 on which external light is incident, and the ¼ wavelength layer 21 may be on an opposite surface of the substrate 1. The organic light-emitting device 3 may be on the ¼ wavelength layer 21. These elements are otherwise as described above.

According to the current embodiment of the present invention, as described above, external light incident on the substrate 1 is converted to linearly polarized light parallel to the transmission axis of the dichroic layer 22 as it passes through the dichroic layer 22. The linearly polarized light is transmitted through the substrate 1 and then converted to circularly polarized light rotating in a first direction as it passes through the ¼ wavelength layer 21. The circularly polarized light rotating in the first direction is reflected, e.g., from a second electrode layer 33 of the organic light-emitting device 3, and thereby converted to circularly polarized light rotating in a second direction. Upon again passing through the ¼ wavelength layer 21, the circularly polarized light rotating in the second direction is converted to linearly polarized light perpendicular to the transmission axis of the dichroic layer 22. Such linearly polarized light cannot pass through the dichroic layer 22, and thus, external light incident on the substrate 1 may not be reflected from the substrate 1.

White light emitted from an emission layer 32 of the organic light-emitting device 3 may be transmitted through the dichroic layer 22 that selectively absorbs light of a specific wavelength band and is thus converted into a predetermined color. A color image may thus be realized without a separate color filter.

Figure 6:
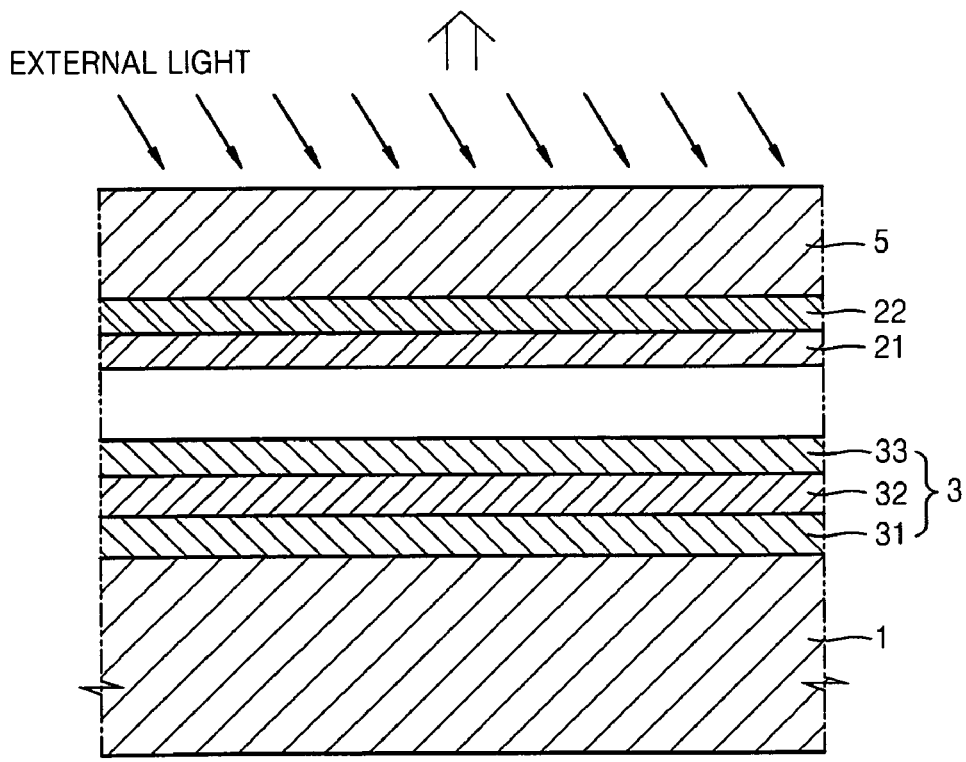
FIGS. 6 through 9 illustrate cross-sectional views of front emission type organic light-emitting display devices according to embodiments of the present invention.

FIG. 6 illustrates a schematic cross-sectional view of a front emission type organic light-emitting display device according to an embodiment of the present invention. Referring to FIG. 6, the organic light-emitting device 3 may be disposed on the substrate 1. The sealing member 5 may be disposed on the organic light-emitting device 3. The dichroic layer 22 and a ¼ wavelength layer 21 may be sequentially stacked on a surface of the sealing member 5 facing the organic light-emitting device 3.

The substrate 1 may be a transparent glass substrate as described above, but does not necessarily have to be transparent in the current embodiment, since light emitted from the emission layer 32 is transmitted towards the sealing member 5. The substrate 1 may be formed of a plastic material or a metal material, in addition to glass. When the substrate 1 is formed of a metal, an insulating film may be disposed on a surface thereof. Although not shown, a buffer layer may be further disposed on the substrate 1 in order to increase surface smoothness and reduce or prevent infiltration of impurities. The buffer layer may be formed of at least one of $SiO_2$ and SiNx, or the like.

The first electrode layer 31 of the organic light-emitting device 3 may be on the substrate 1. The material for forming the first electrode layer 31 may have a high work function, e.g., ITO, IZO, ZnO, $In_2O_3$, or the like. The first electrode layer 31 may serve as an anode. If the first electrode layer 31 serves as a cathode, the first electrode layer 31 may be formed of a reflective material, e.g., Mg, Al, Pt, Pd, Au, Ni, Nd, Ir, Cr, or a compound thereof, so that the first electrode layer 31 may also serve as a reflective layer. Hereinafter, the current embodiment of the present invention will be described in terms of the use of the first electrode layer 31 as an anode.

A second electrode layer 33 of the organic light-emitting device 3 may be a transmissive electrode. Thus, the second electrode layer 33 may be formed as a thin translucent film using a metal with a low work function, e.g., Li, Ca, LiF/Ca, LiF/Al, Al, Mg, or Ag. A transparent and conductive structure, e.g., ITO, IZO, ZnO, or $In_2O_3$, or the like, may be formed on such a metal translucent film to compensate for a high resistance problem arising from the thinness of the translucent film.

The emission layer 32 may be interposed between the first electrode layer 31 and the second electrode layer 33, and is as described above.

The sealing member 5 may be on the organic light-emitting device 3 in order to protect the organic light-emitting device 3 from external contaminants. In the current embodiment of the present invention, the sealing member 5 may be transparent, the dichroic layer 22 may be on a surface of the sealing member 5, and the ¼ wavelength layer 21 may be on the surface of the dichroic layer 22 facing the organic light-emitting device 3. Therefore, white light emitted from the emission layer 32 transmitted through the dichroic layer 22 may form a predetermined color image. Also, external light incident on an upper surface of the sealing member 5 passes through the sealing member 5, and then passes through the dichroic layer 22 and the ¼ wavelength layer 21 in sequence. The incident light, after being reflected, e.g., from each of the first and second electrode layers 31 and 33 of the organic light-emitting device 3, cannot pass through the dichroic layer 22, thereby preventing a reduction in contrast. The principle is as described above, and thus, a detailed description thereof will not be repeated.

Figure 7:
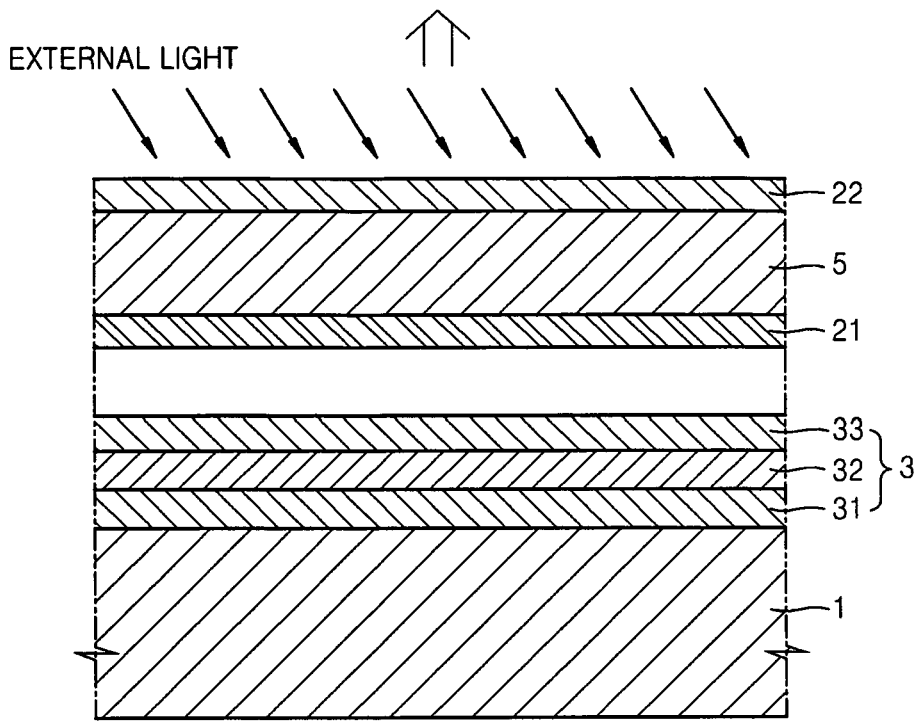

FIG. 7 illustrates a schematic cross-sectional view of a front emission type organic light-emitting display device according to another embodiment of the present invention. Referring to FIG. 7, the dichroic layer 22 may be on an outer surface of the sealing member 5, i.e., a surface on which external light is incident, and the ¼ wavelength layer 21 may be on an inner surface of the sealing member 5, i.e., the surface facing an organic light-emitting device 3. As described above, external light incident on the front emission type organic light-emitting display device, indicated by the arrows, may be converted to linearly polarized light parallel to the transmission axis of the dichroic layer 22 upon passing through the dichroic layer 22. The linearly polarized light may be converted to circularly polarized light rotating in a first direction as it passes through the ¼ wavelength layer 21. The circularly polarized light rotating in the first direction may be reflected from the organic light-emitting device 3, thus being converting into circularly polarized light rotating in a second direction. Upon again passing through the ¼ wavelength layer 21, the circularly polarized light rotating in the other direction is converted to linearly polarized light perpendicular to the transmission axis of the dichroic layer 22. Such linearly polarized light cannot pass through the dichroic layer 22, and thus, the externally incident light cannot be reflected from the front emission type organic light-emitting display device according to the current embodiment of the present invention. White light emitted from the emission layer 32 is transmitted through the dichroic layer 22 and forms a predetermined color image.

Figure 8:
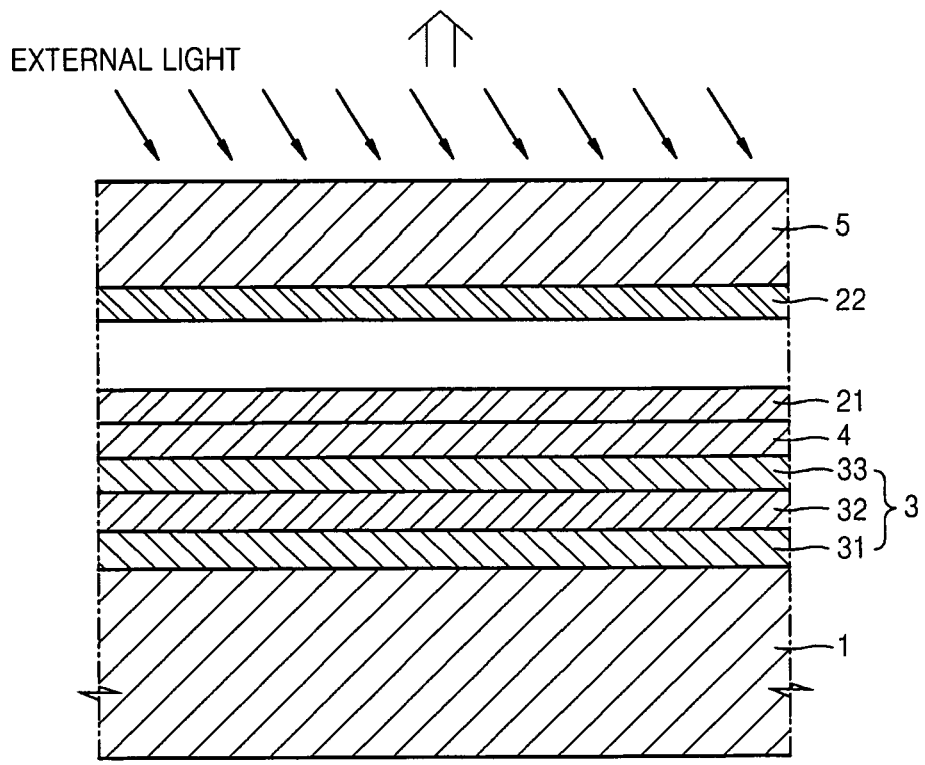
Figure 9:
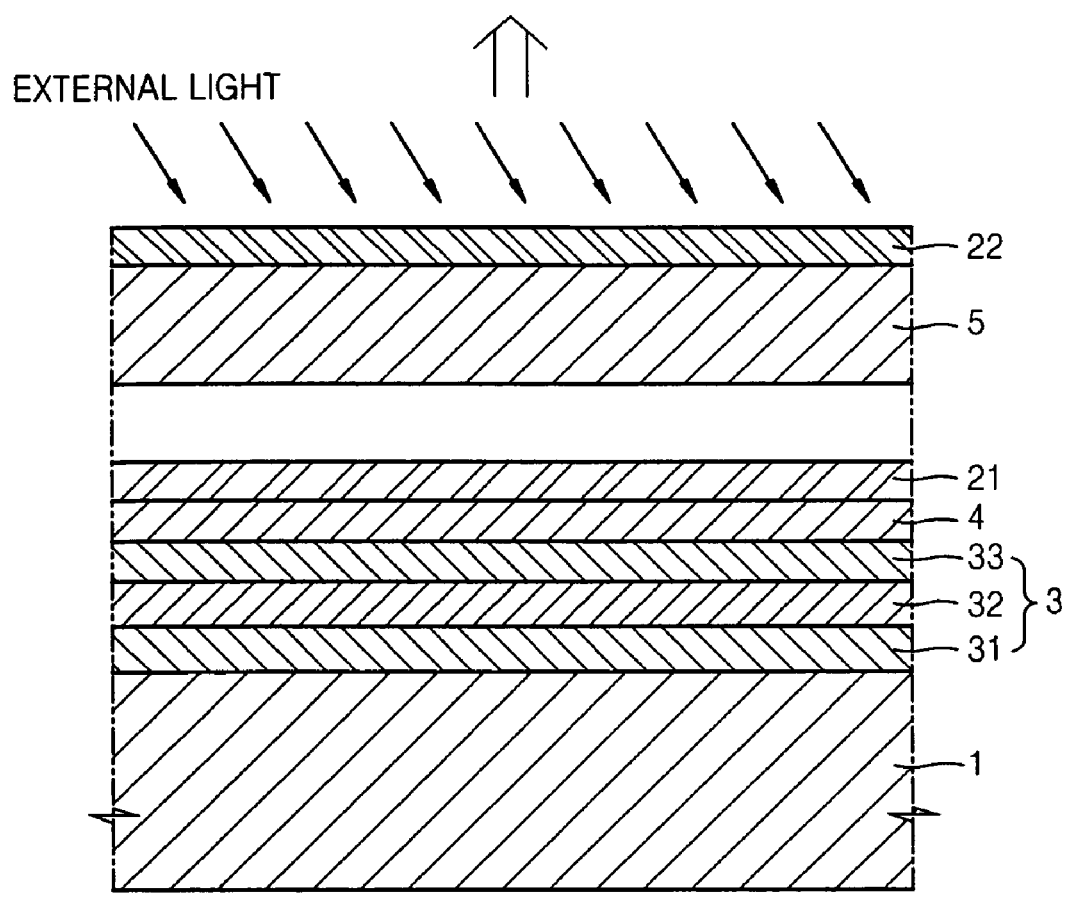

FIGS. 8 and 9 illustrate schematic cross-sectional views of front emission type organic light-emitting display devices where a protective layer 4 is further disposed on the organic light-emitting device 3, and the ¼ wavelength layer 21 is on the protective layer 4 according to other embodiments of the present invention.

In the front emission type organic light-emitting display device of FIG. 8, the dichroic layer 22 may be on an inner surface of the sealing member 5, while in the front emission type organic light-emitting display device of FIG. 9, the dichroic layer 22 may be on an outer surface of the sealing member 5.

In both embodiments illustrated in FIGS. 8 and 9, the ¼ wavelength layer 21 may be on the protective layer 4 on the organic light-emitting device 3. The protective layer 4 may serve to prevent damage to the second electrode layer 33 of the organic light-emitting device 3 during the formation of the ¼ wavelength layer 21, and may be a transparent inorganic or organic material.

Examples of the inorganic material that may be used to form the protective layer 4 include metal oxide, metal nitride, metal carbide, metal oxynitride, and compounds thereof. The metal oxide may be silicon oxide, aluminum oxide, titanium oxide, indium oxide, tin oxide, indium tin oxide, or a compound thereof. The metal nitride may be aluminum nitride, silicon nitride, or a compound thereof. The metal carbide may be silicon carbide, and the metal oxynitride may be silicon oxynitride. The inorganic material may also be silicon, a ceramic derivative of silicon, or a ceramic derivative of metal. In addition, the inorganic material may be diamond-like carbon (DLC) or the like.

Examples of the organic material that may be used to form the protective layer 4 include organic polymers, inorganic polymers, organometallic polymers, and hybrid organic/inorganic polymers. For example, acryl resin may be used.

As described above, white light emitted from the emission layer 32 of the organic light-emitting device 3 may be transmitted through the dichroic layer 22 to form a predetermined color image. Also, external light incident on an upper surface of the sealing member 5 cannot pass through the dichroic layer 22, thereby preventing a reduction in contrast. The principle is as described above, and thus, a detailed description thereof will not be repeated.

Figure 10:
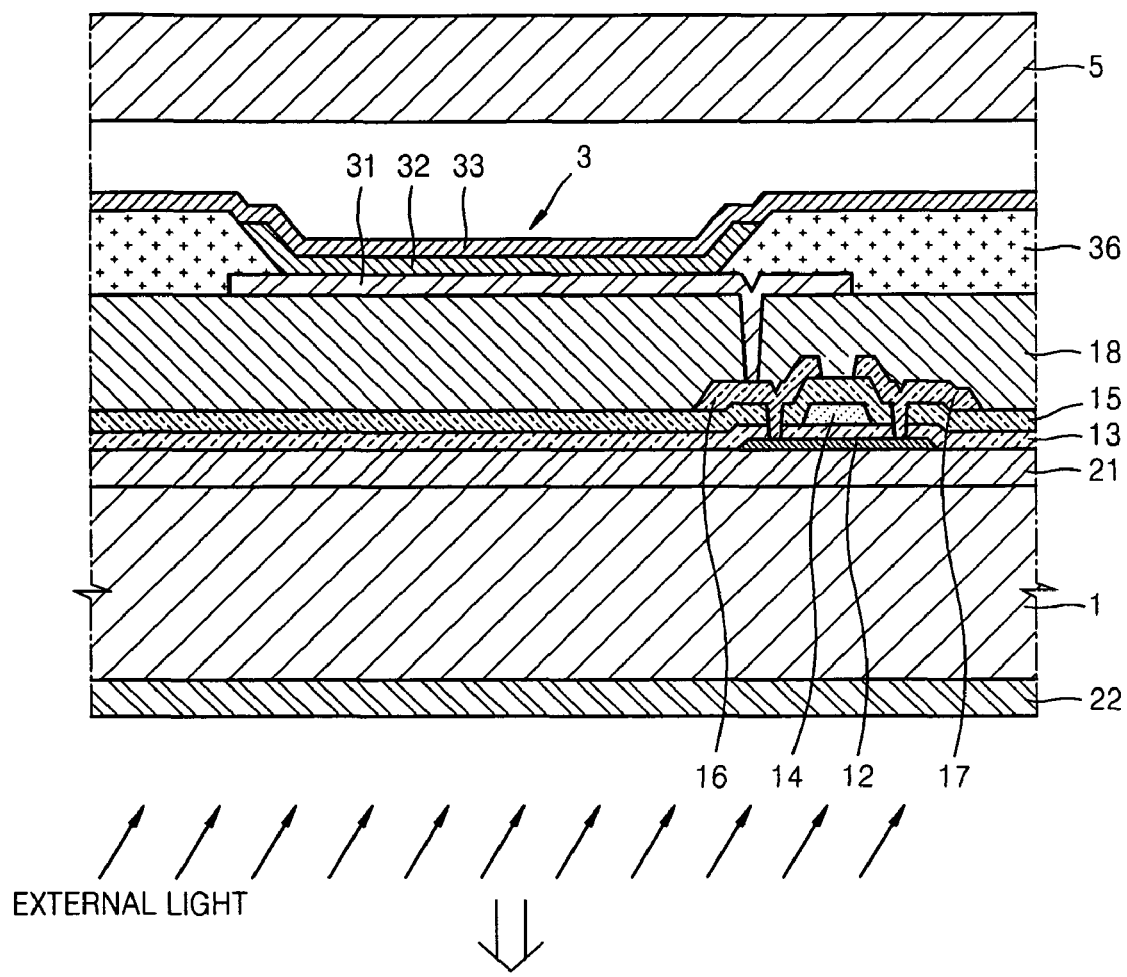
FIG. 10 illustrates a cross-sectional view of a rear emission type active matrix (AM) organic light-emitting display device according to another embodiment of the present invention.

FIG. 10 illustrates a cross-sectional view of a rear emission type active matrix (AM) organic light-emitting display device according to another embodiment of the present invention.

Referring to FIG. 10, the dichroic layer 22 may be on a surface of the substrate 1 on which external light is incident. A TFT may be disposed on a surface of the substrate 1 opposite that on which external light is incident. Each of a plurality of pixels of the rear emission type AM organic light-emitting display device may include at least one TFT electrically connected to the organic light-emitting device 3.

In detail, the ¼ wavelength layer 21 may be on the surface of the substrate 1. Although not shown, a buffer layer may be on an upper surface and/or a lower surface of the ¼ wavelength layer 21. A semiconductor active layer 12 may be formed in a predetermined pattern on the ¼ wavelength layer 21. A gate insulating film 13, e.g., SiO$_2$, SiNx, or the like, may be on the semiconductor active layer 12, and a gate electrode 14 may be on a portion of the gate insulating film 13. The gate electrode 14 may be connected to a gate line (not shown) supplying a TFT ON/OFF signal. An inter-insulating layer 15 may be on the gate electrode 14, and source/drain electrodes 16 and 17 may contact a source/drain region of the semiconductor active layer 12 through a contact hole.

A passivation layer 18 may be formed of at least one of an organic material and an inorganic material, and may be disposed on the source/drain electrodes 16 and 17. The first electrode layer 31, which is used as an anode, may be on the ¼ wavelength layer 21 and covered with a pixel-defining layer 36 formed of an insulating material. An opening may be formed in the pixel-defining layer 36, and the emission layer 32 of the organic light-emitting device 3 may be formed in a region defined by the opening. The second electrode layer 33 of the organic light-emitting device 3 may be on the emission layer 32 so that all pixels are covered with the second electrode layer 33. The sealing member 5 may be on the organic light-emitting device 3. The sealing member 5 may be, e.g., glass, a metal cap, a multi-layer structure of organic/inorganic thin films, and so forth.

In the above-described AM-type structure, the dichroic layer 22 and the ¼ wavelength layer 21 may prevent the reflection of external light incident on the bottom side of the substrate 1 since the external light passes through the dichroic layer 22 and the ¼ wavelength layer 21 in sequence. White light emitted from the emission layer 32 is transmitted through the substrate 1 and the dichroic layer 22, thereby forming a predetermined color image.

In the rear emission type AM organic light-emitting display device according to the current embodiment of the present invention, provided that the dichroic layer 22 is disposed such that external light is incident thereon, and the ¼ wavelength layer 21 is disposed to face the organic light-emitting device 3, i.e., such that external light is incident on the dichroic layer 22 before the ¼ wavelength layer 21, the ¼ wavelength layer 21 may be on any surface of the substrate 1, the TFT, or the organic light-emitting device 3.

Figure 11:
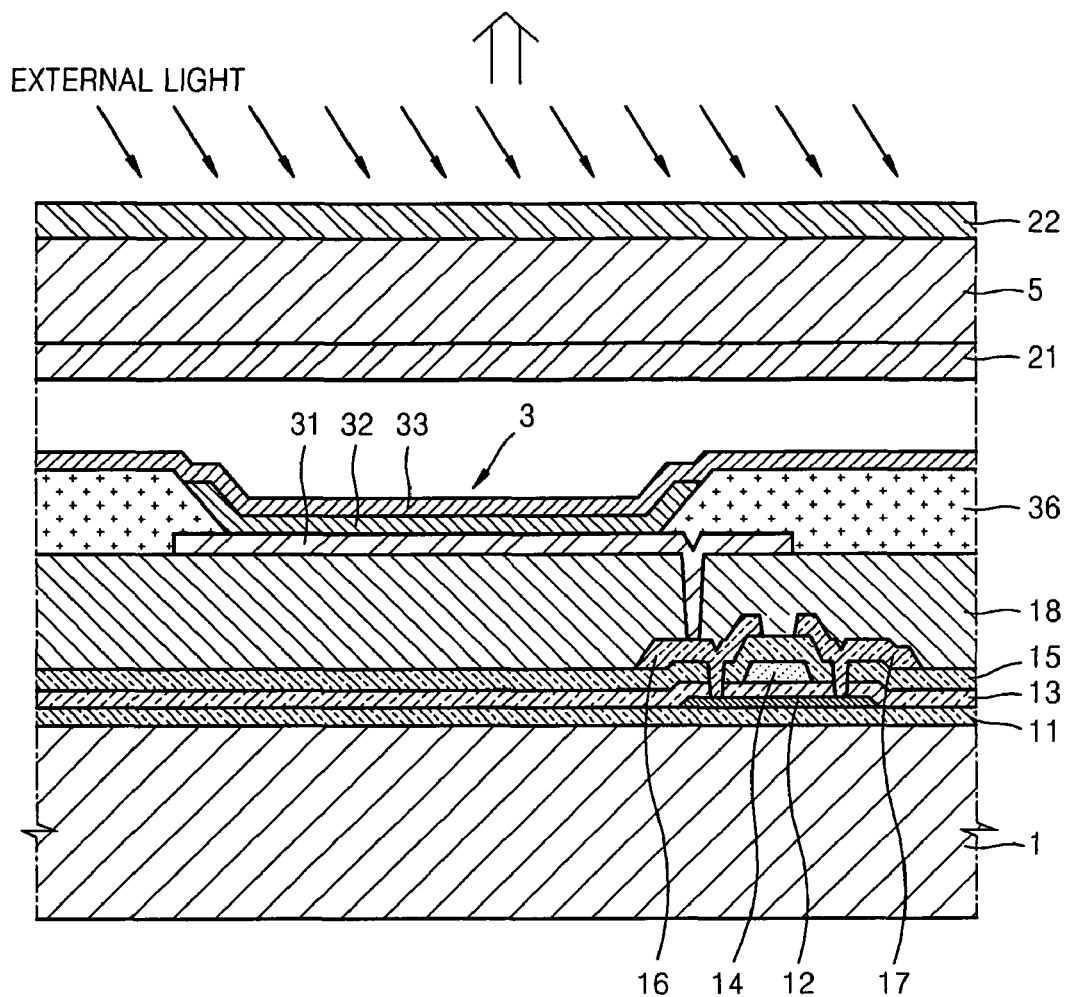
FIG. 11 illustrates a cross-sectional view of a front emission type AM organic light-emitting display device according to an embodiment of the present invention.

FIG. 11 illustrates a cross-sectional view of a front emission type AM organic light-emitting display device according to an embodiment of the present invention.

Referring to FIG. 11, a TFT may be on the substrate 1. Each of a plurality of pixels of the front emission type AM organic light-emitting display device may include at least one TFT electrically connected to the organic light-emitting device 3. The structure of the TFT is as described above with reference to FIG. 10, and thus, a detailed description thereof will not be repeated.

The TFT may be covered with the passivation layer 18. The first electrode layer 31, which is used as an anode, may be on the passivation layer 18 and covered with the pixel-defining layer 36 formed of an insulating material. An opening may be formed in the pixel-defining layer 36, and the emission layer 32 may be disposed in a region defined by the opening. The second electrode layer 33 may be on the emission layer 32 and cover all the pixels.

In the current embodiment of the present invention, the ¼ wavelength layer 21 may be on a surface of the sealing member 5 facing the organic light-emitting device 3 and the dichroic layer 22 may be on the other surface of the sealing member 5. Therefore, the dichroic layer 22 and the ¼ wavelength layer 21 may prevent the reflection of light incident on the top surface of the sealing member 5, and white light emitted from the emission layer 32 may be transmitted through the dichroic layer 22, thereby forming a predetermined color image.

Although not shown, provided that the dichroic layer 22 is disposed such that external light is incident thereon before the ¼ wavelength layer 21, i.e., is closer to a viewing surface of the display device, the same principle as described above may be applied to PM organic light-emitting display devices.

According to the above-described display devices having a white light source according to embodiments, at least one of the following advantages may be obtained. First, a circular polarization layer may be formed using a dichroic layer and a ¼ wavelength layer, thereby preventing the reflection of external light, resulting in better contrast. Second, an adhesive for attaching the circular polarization layer may not be needed, thereby decreasing the thickness of a display device and preventing a reduction in brightness. Third, a display device having a white light source may display a color image without a color filter.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light emitting display apparatus, comprising:
a substrate;
an organic light-emitting device emitting white light on the substrate;
a dichroic layer including ellipsoidal shaped metal particles directly on a surface between a viewing surface of the display apparatus and the organic light-emitting device emitting white light, the dichroic layer being configured to allow light of a predetermined wavelength band to be transmitted therethrough, the predetermined wavelength band being in accordance with an aspect ratio of the metal particles; and
a ¼ wavelength layer between the dichroic layer and the organic light-emitting device emitting white light.

2. The organic light emitting display apparatus as claimed in claim 1, wherein the dichroic layer is on the substrate, the ¼ wavelength layer is on the dichroic layer, and organic light-emitting device emitting white light is on the ¼ wavelength layer.

3. The organic light emitting display apparatus as claimed in claim 1, wherein the ¼ wavelength layer is on a surface of the substrate, the organic light-emitting device emitting white light is on the ¼ wavelength layer, and the dichroic layer is on a surface of the substrate opposite to that of the ¼ wavelength layer.

4. The organic light emitting display apparatus as claimed in claim 1, wherein the dichroic layer comprises three areas through which red, blue, and green light is transmitted, respectively.

5. The organic light emitting display apparatus as claimed in claim 1, further comprising a sealing member on the organic light-emitting device emitting white light.

6. The organic light emitting display apparatus as claimed in claim 5, wherein an image is displayed towards the sealing member.

7. The organic light emitting display apparatus as claimed in claim 5, wherein the sealing member is transparent, the dichroic layer is on a surface of the sealing member facing the organic light-emitting device emitting white light, and the ¼ wavelength layer is on a surface of the dichroic layer facing the organic light-emitting device emitting white light.

8. The organic light emitting display apparatus as claimed in claim 5, wherein the sealing member is transparent, the ¼ wavelength layer is on a surface of the sealing member facing the organic light-emitting device emitting white light, and the dichroic layer is on a surface of the sealing member opposite that of the ¼ wavelength layer.

9. The organic light emitting display apparatus as claimed in claim 5, further comprising a protective layer on the organic light-emitting device emitting white light,
wherein the sealing member is transparent, the dichroic layer is on a surface of the sealing member facing the organic light-emitting device emitting white light, and the protective layer is between the organic light-emitting device emitting white light and the ¼ wavelength layer.

10. The organic light emitting display apparatus as claimed in claim 5, further comprising a protective layer on the organic light-emitting device emitting white light,
wherein the sealing member is transparent, the protective layer is disposed between the organic light-emitting device emitting white light and the ¼ wavelength layer, and the dichroic layer is on a surface of the sealing member opposite that of the ¼ wavelength layer.

11. The organic light emitting display apparatus as claimed in claim 5, further comprising a protective layer on the organic light-emitting device emitting white light, wherein the protective layer includes at least one of an organic insulating material and an inorganic insulating material.

12. The organic light emitting display apparatus as claimed in claim 1, wherein an image is displayed towards the substrate.

13. The organic light emitting display apparatus as claimed in claim 12, wherein the substrate is transparent.

14. The organic light emitting display apparatus as claimed in claim 1, further comprising a thin film transistor on the substrate, the organic light-emitting device emitting white light being electrically connected to the thin film transistor.

15. The organic light emitting display apparatus as claimed in claim 14, wherein the dichroic layer is on the substrate, the ¼ wavelength layer is on the dichroic layer, and the thin film transistor and the organic light-emitting device emitting white light are on the ¼ wavelength layer.

16. The organic light emitting display apparatus as claimed in claim 14, wherein the ¼ wavelength layer is on a surface of the substrate, the thin film transistor and the organic light-emitting device emitting white light are on the ¼ wavelength layer, and the dichroic layer is on a surface of the substrate opposite that of the ¼ wavelength layer.

17. The organic light emitting display apparatus as claimed in claim 1, wherein the dichroic layer consists essentially of the ellipsoidal shaped metal particles.

18. The organic light emitting display apparatus as claimed in claim 1, wherein the ellipsoidal shaped metal particles have an aspect ratio lower than 5.

19. The organic light emitting display apparatus as claimed in claim 5, wherein the ellipsoidal shaped metal particles are directly imprinted to the sealing member or to the substrate.

* * * * *